(12) United States Patent
Ahmed

(10) Patent No.: US 9,857,424 B2
(45) Date of Patent: Jan. 2, 2018

(54) AUTOMATED TEST EQUIPMENT, INSTRUCTION PROVIDER FOR PROVIDING A SEQUENCE OF INSTRUCTIONS, METHOD OF PROVIDING SIGNAL TO A DEVICE UNDER TEST, METHOD FOR PROVIDING A SEQUENCE OF INSTRUCTIONS AND TEST SYSTEM

(71) Applicant: Advantest Corporation, Tokyo (JP)

(72) Inventor: Kazi Iftekhar Ahmed, Stuttgart (DE)

(73) Assignee: Advantest Corporation, Tokyo (JP)

( * ) Notice: Subject to any disclaimer, the term of this patent is extended or adjusted under 35 U.S.C. 154(b) by 13 days.

(21) Appl. No.: 15/016,640

(22) Filed: Feb. 5, 2016

(65) Prior Publication Data

US 2016/0154060 A1 Jun. 2, 2016

Related U.S. Application Data

(63) Continuation of application No. PCT/EP2013/066728, filed on Aug. 9, 2013.

(51) Int. Cl.
G01R 31/28 (2006.01)
G01R 31/3177 (2006.01)
G01R 31/319 (2006.01)
G01R 31/317 (2006.01)

(52) U.S. Cl.
CPC ... *G01R 31/3177* (2013.01); *G01R 31/31703* (2013.01); *G01R 31/31917* (2013.01)

(58) Field of Classification Search
CPC .......... G01R 31/3177; G01R 31/31703; G01R 31/31917

See application file for complete search history.

(56) References Cited

U.S. PATENT DOCUMENTS

| 2002/0108079 | A1  | 8/2002 | Takahashi |             |
|--------------|-----|--------|-----------|-------------|
| 2009/0115443 | A1* | 5/2009 | Lai       | G11C 29/56012 |
|              |     |        |           | 324/759.01 |
| 2012/0221285 | A1* | 8/2012 | Conner    | G01R 31/31919 |
|              |     |        |           | 702/119 |
| 2014/0207402 | A1* | 7/2014 | Ferry     | G06F 17/00 |
|              |     |        |           | 702/119 |

FOREIGN PATENT DOCUMENTS

WO    WO2011141049    11/2011

* cited by examiner

*Primary Examiner* — Thien D Nguyen

(57) ABSTRACT

An automated test equipment includes a test processor configured to provide a signal to a device under test on the basis of a sequence of instructions defining an evaluation of test vectors. The test processor is configured to map a test vector onto a set of signal states or signal transitions. Furthermore, the test processor is configured to variably select a number of signal states or signal transitions provided in the signal based on a current test vector in dependence on a current instruction.

18 Claims, 8 Drawing Sheets

Table:

| Vector | Actions | | | |
|--------|---|---|---|---|
|        | 0 | 1 | 2 | 3 |
| 0x00   | H | L | X | X |
| 0x01   | L | H | H | X |
| 0x02   | H | H | L | L |
| 0x03   | H | X | L | X |
| 0x04   | L | X | H | X |
| 0x05   | L | H | L | H |
| 0x06   | H | L | H | H |
| 0x07   | L | L | L | H |
| 0x08   | L | X | X | X |

FIG 3A (Prior Art)

Initial ATE signal

| H H L L | L H H L L | L H L H | L H L H | L H L H | H X L X | H X L X |
|---|---|---|---|---|---|---|
| 0x02 | 0x02 | 0x05 | 0x05 | 0x05 | 0x03 | 0x03 |

FIG 3B (Prior Art)

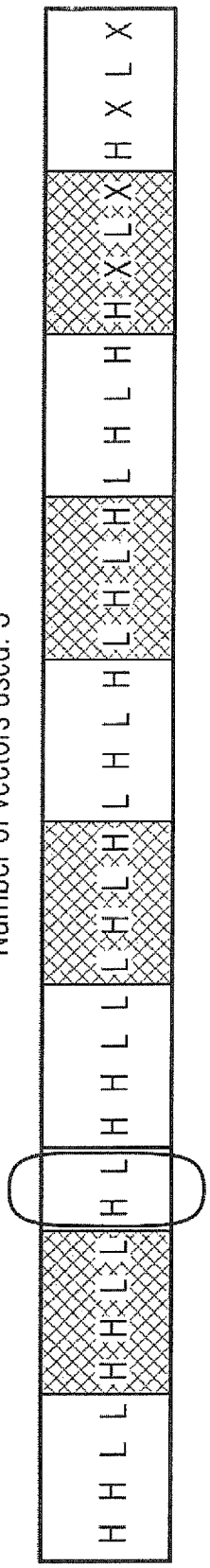

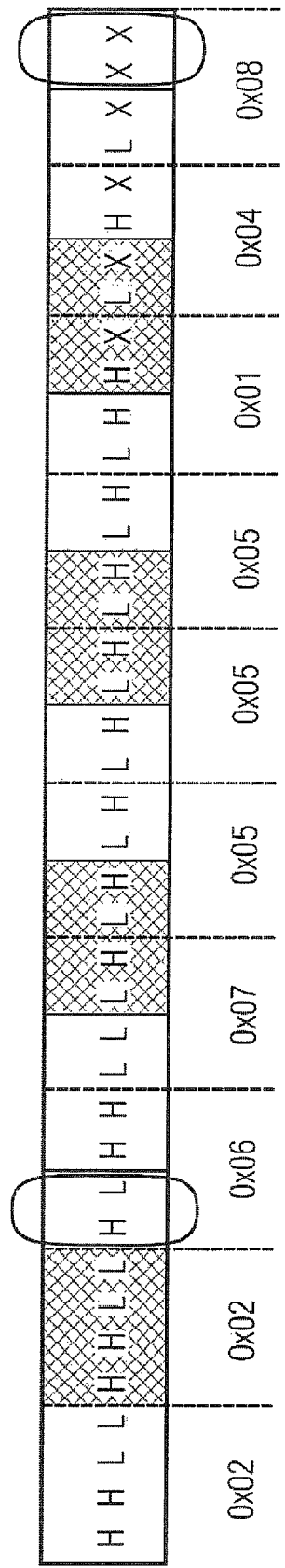

FIG 3G

With Partial Vector Exec

| 2x | 1x(2E) | 1x | 4x | 2x |
|---|---|---|---|---|
| 0x02 | 0x00 | 0x02 | 0x05 | 0x03 |

FIG 3H

Insert 2 action (HL)

| H H L L | H×H×L×L× | H L | 2E | H L H L | L×H×L×H× | L H L H | L×H×L×H× | L H L H | H×X×L×X× | H X L X |
|---|---|---|---|---|---|---|---|---|---|---|
| 0x02 | 0x02 | | 0x00 | 0x02 | 0x05 | 0x05 | 0x05 | 0x05 | 0x03 | 0x03 |

Original program:

REPEAT (0x02, 3) // generate vector 0x02, 3 times

REPEAT (0x05, 4) // generate vector 0x05, 4 times

REPEAT (0x03, 3) // generate vector 0x03, 2 times

FIG 4A
(Prior Art)

After modification (with PVE)

REPEAT (0x02, 2) // generate vector 0x02, 2 times

REPEAT_E(2, 0x00, 1) // generate 2 Edges from vector 0x00, 1 time

REPEAT (0x02, 1) // generate vector 0x02, 1 times

REPEAT (0x05, 4) // generate vector 0x05, 4 times

REPEAT (0x03, 2) // generate vector 0x03, 2 times

FIG 4B

AUTOMATED TEST EQUIPMENT, INSTRUCTION PROVIDER FOR PROVIDING A SEQUENCE OF INSTRUCTIONS, METHOD OF PROVIDING SIGNAL TO A DEVICE UNDER TEST, METHOD FOR PROVIDING A SEQUENCE OF INSTRUCTIONS AND TEST SYSTEM

CROSS-REFERENCE TO RELATED APPLICATIONS

This application is a continuation of copending International Application No. PCT/EP2013/066728, filed Aug. 9, 2013, which is incorporated herein by reference in its entirety.

BACKGROUND OF THE INVENTION

Embodiments of the present invention relate to an automated test equipment and an instruction provider for providing a sequence of instructions. Further embodiments of the present invention relate to a method for providing a signal to a device under test and a method for providing a sequence of instructions. Further embodiments of the present invention relate to a test system comprising such automated test equipment and instruction provider.

In conventional test systems the number of drive (receive/tristate edges in a test vector which are associated with a test vector are fixed. Such an association of signal edges to a vector achieves two things: a higher throughput at the same clock frequency and a compression of data. Also, in the application such number of edges in a vector is fixed for a pattern, dictated by a requirements such as throughput, stability, signal integrity, etc.

The fixed nature of such edges in a vector creates different problems, especially for protocol type patterns when the natural boundary of a protocol does not fit to the selected number of edges in a vector (also called xmode) properly. In this case the assembly of different packets becomes difficult, as the pattern generator either has to add unnecessitated nop( ) type operation (so-called padding) or to perform time expensive operations to merge consecutive operation packets.

Furthermore, interactive modifications (e.g. during a Debug) on a compiled pattern is slow because the system has to reassemble the whole pattern or the user has to insert useless vectors to meet the vector boundary. Furthermore, pre-execution modification (such as SMT8 bind time) is also difficult.

SUMMARY

According to an embodiment, an automated test equipment may have: a test processor configured to provide a signal to a device under test on the basis of a sequence of instructions defining an evaluation of test vectors; wherein the test processor is configured to map a test vector onto a set of signal states or signal transitions; and wherein the test processor is configured to variably select a number of signal states or signal transitions provided in the signal based on a current test vector in dependence on a current instruction; wherein each test vector is mapped onto a fixed number of signal states or signal transitions; and wherein the test processor is configured to select the number of signal states or signal transitions of the current test vector to be provided in the signal in dependence on the current instruction.

According to another embodiment, a method for providing a signal to a device under test may have the steps of: providing the signal to the device under test on the basis of a sequence of instructions defining an evaluation of test vectors, a test vector being mapped onto a set of signal states or signal transitions; wherein a number of signal states or signal transitions of a current test vector provided in the signal is variably selected in dependence on a current instruction; wherein each test vector is mapped onto a fixed number of signal states or signal transitions; and selecting the number of signal states or signal transitions of the current test vector to be provided in the signal in dependence on the current instruction.

Another embodiment may have an instruction provider for providing a sequence of instructions defining an evaluation of test vectors, wherein each test vector is associated to a predetermined set of signal states or signal transitions; wherein the instruction provider is configured to provide the sequence of instructions such that at least a first instruction in the sequence of instructions defines a provision of a true subset of the set of signal states or signal transitions associated with a test vector; wherein the instruction provider is configured to provide in the sequence of instructions a first type of instruction defining a test vector and a provision of a number of signal states or signal transitions of the set of signal states or signal transitions associated with the test vector; wherein the first instruction is from the first type of instructions; and wherein the instruction provider is further configured to provide in the sequence of instructions a second type of instruction defining a test vector and a provision of the complete set of signal states or signal transitions associated with the test vector.

According to another embodiment, a method for providing a sequence of instructions defining an evaluation of test vectors, wherein each test vector is associated with a predetermined set of signal states or signal transitions, may have the steps of: providing the sequence of instructions such that at least a first instruction in the sequence of instructions defines a provision of a true subset of the set of signal states or signal transitions associated with a test vector; providing in the sequence of instructions a first type of instruction defining a test vector and a provision of a number of signal states or signal transitions of the set of signal states or signal transitions associated with the test vector; wherein the first instruction is from the first type of instructions; and providing in the sequence of instructions a second type of instruction defining a test vector and a provision of the complete set of signal states or signal transitions associated with the test vector.

According to another embodiment, a test system may have: an inventive test equipment; and an inventive instruction provider.

Another embodiment may have a non-transitory digital storage medium having a computer program stored thereon to perform the inventive methods when said computer program is run by a computer.

Embodiments of the present invention relate to an automated test equipment. The automated test equipment comprises a test processor configured to provide a signal to a device under test on the basis of a sequence of instructions defining an evaluation of test vectors. The test processor is further configured to map a test vector onto a set of signal states or signal transitions. Furthermore, the test processor is configured to variably select a number of signal states or signal transitions provided in the signal based on a current test vector in dependence on a current instruction.

It has been found by the inventors that a more flexible and therefore an improved concept for providing a signal to a device under test can be achieved, when a test processor is configured to variably select a number of signal states or signal transitions provided in a signal provided to a device under test based on a current test vector in dependence on a current instruction. Hence, when compared to conventional systems this concept adds the flexibility to the test processor of only partly executing a test vector. Hence, such a test processor enables the performing of only a part of the signal transitions or signal states mapped to a test vector which enables a higher flexibility.

As an example, assuming a fixed test vector length of four signal states or signal transitions (so-called xmode 4) in conventional systems, the complete set of signal states or signal transitions of the test vector are provided to a device under test. An insertion of two additional signal states or signal transitions between a sequence of such test vectors would not be possible or would be complicated, as this would lead to a change of all other subsequent coming test vectors (as is also described in more detail in FIG. 3f). But embodiments of the present invention solve this problem by adding flexibility to the automated test equipment of performing only a selected number of signal states or signal transitions of a vector (such as the first two signal transitions or signal states of four signal transitions or signal states onto which the test vector is mapped).

Hence, the test processor of the automated test equipment is capable of generating only a part of a single test vector, while the rest of the test vector will be discarded and the signal transitions or signal states of the following test vector will replace the discarded part of the test vector which was only partly executed. This allows a lot of flexibility on the software side to easy assemble packets and to perform a fast modification even on compiled patterns.

Further embodiments of the present invention relate to an instruction provider for providing a sequence of instructions defining an evaluation of test vectors, wherein each test vector is associated with a predetermined set of signal states or transitions. The instruction provider is configured to provide the sequence of instructions such that at least a first instruction defines a provision of a true subset of the signal states or signal transitions associated with a test vector.

By further having the instruction provider being capable of providing the sequence of instructions such that at least a first instruction defines a provision (e.g. in a signal to be provided to a device under test by the automated test equipment) of a true subset of the signal states or signal transitions associated with a test vector, it can be achieved that in a test processor, which processes the sequence of instructions to provide a signal to a device under test, this test processor only executes parts of a test vector and not the complete test vector (although a number of signal states or signal transitions onto which the test vector is mapped are fixed). As already described in conjunction with the automated test equipment, by having such instructions in a sequence of instructions which enable the provision of only a part of a test vector in a signal provided to a device under test a more flexible and therefore more improved concept for providing a signal to a device under test can be achieved. Hence, embodiments of the present invention provide an instruction provider which is capable of generating a new instruction (the first instruction) which not only defines a test vector to perform but also defines the number of signal states or signal transitions associated to the test vector which are to be performed based on the first instruction by a test processor.

As an example, the instruction processor can be configured to provide the sequence of instructions such that at least a second instruction defines a provision (in a signal to be provided to a device under test) of a further true subset or of the complete subset of the signal states or signal transitions associated with the test vector. The further subset is different from the true subset. In other words, such second instruction may comprise another number of signal transitions or signal states of the test vector to be performed or may comprise an information that the complete set of signal transition or signal states onto which the test vector is mapped (or which are associated to the test vector) are to be performed.

According to further embodiments, the instruction provider can be configured to provide in the sequence of instructions at least a first type of instruction defining a test vector and a number of signal states or signal transitions associated with the test vector to be provided. The first instruction described above is from the first type of instruction. Furthermore, the instruction provider can be configured to provide a second type of instruction which defines a test vector and furthermore defines that the complete set of signal states or signal transitions associated with the test vector is to be provided. In other words, the instruction provider can be configured to provide at least two different types of instructions one which defines the test vector and the number of signal transitions or signal states of the test vector to be performed and another one which only defines the test vector to be performed in complete.

Furthermore, the instruction provider can be configured to provide the sequence of instructions such that at least the first instruction contains information defining a number of times the true subset is to be provided subsequently (in a signal provided to a device under test).

Further embodiments of the present invention relate to a method for providing a signal to a device under test. The method can be performed, for example, using the automated test equipment.

Further embodiments of the present invention relate to a method for providing a sequence of instructions defining an evaluation of test vectors. The method may be performed, for example, using the instruction provider.

Further embodiments of the present invention relate to a test system comprising the automated test equipment and the instruction provider.

BRIEF DESCRIPTION OF THE DRAWINGS

Embodiments of the present invention will be detailed subsequently referring to the appended drawings, in which:

FIGS. 3A-3H show an example of the comparison of the generation of a test vector stream using a conventional system and using the concept of the present invention;

FIGS. 4A-4B show an example for the operational code which implements the example described in conjunction with FIGS. 3A-3H;

DETAILED DESCRIPTION OF THE INVENTION

Figure 1:
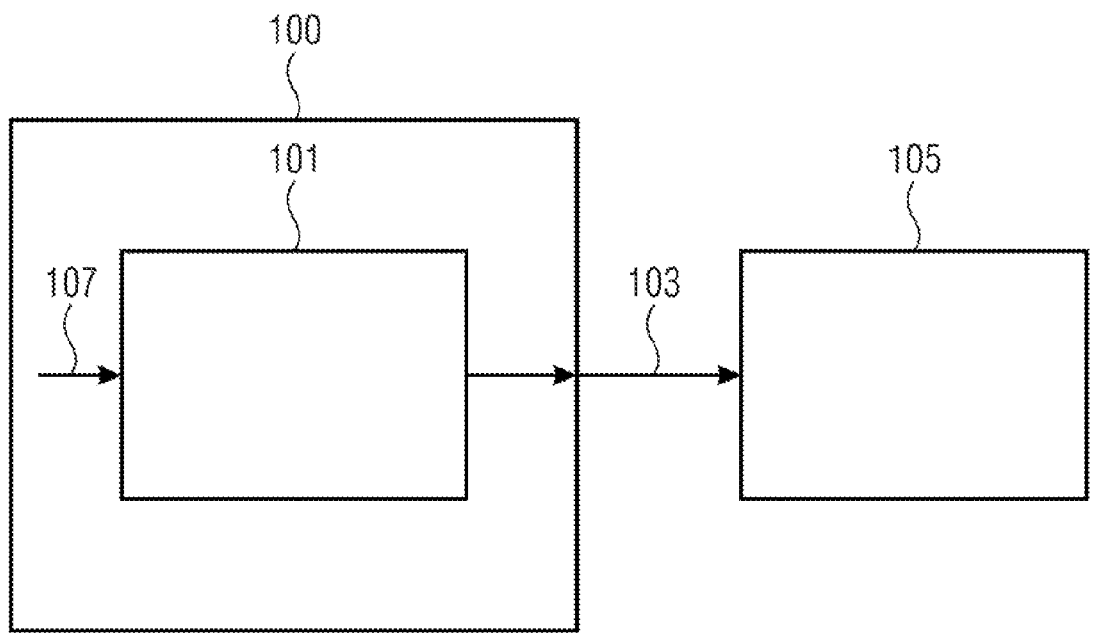
FIG. 1 shows a block schematic diagram of an automated test equipment according to an embodiment of the present invention.

FIG. 1 shows a block schematic diagram of an automated test equipment 100, the automated test equipment 100 comprises a test processor 101. The test processor 101 is configured to provide a (test) signal 103 to a device under test 105 on the basis of a sequence 107 of instructions. The instructions define an evaluation of test vectors. Furthermore, the test processor 101 is configured to map a test vector onto a set of signal states or signal transitions (such as signal edges). Furthermore, the test processor 101 is configured to variably select a number of signal states or signal transitions provided in the signal 103 based on a current test vector in dependence on a current instruction (in the sequence 107 of instructions).

In other words, the test processor 101 receives the sequence 107 of instructions and provides in dependence on the sequence 107 of instructions the signal 103 to the device under test 105. The instructions define an evaluation of test vectors. The test vectors are mapped onto a set of signal edges or signal transitions (such as a low state, a high state or a floating state or a driving state, a receiving state or a tristate) of the signal 103. Hence, each test vector has an associated set of (subsequent) signal states or signal transitions which are provided in the signal 103 in dependence on the sequence 107 of instructions. The test processor 101 is now configured to variably select a number of signal states or signal transitions which are associated with the current test vector being provided in the signal 103 in dependence on the current instruction. In other words, the test processor 101 is capable of receiving an instruction which not only defines a test vector but also defines a number of the signal states or signal transitions associated with the current test vector which are to be provided in the signal 103 to the device under test 105. As an example, the current test vector may have a number m of (subsequent) signal states or signal transitions associated with it but the current instruction only defines n of the signal states or signal transitions to be provided in the signal 103 to the device under test 105. In this example typically n is smaller than m. Hence, only a subset (n) of the signal states or signal transitions associated with the current test vector are provided in the signal 103 to the device under test 105 by the test processor 101, while the remaining signal states or signal transitions (m-n) associated with the current test vector are discarded or omitted.

Furthermore, each test vector can be mapped onto a fixed number of signal states or signal transitions. The test processor 101 can be configured to select the number of signal states or signal transitions of the current test vector to be provided in the signal 103 in dependence on the current instruction. In other words, although each test vector is mapped onto a fixed number of signal states or signal transitions, the test processor 101 can be configured to only choose a smaller number of signal states or signal transitions of the current test vector to be provided in the signal 103 depending on the current instruction. The test processor 101 is therefore not bound to the number of signal states or signal transitions onto which the test vector is mapped as it can be determined by the instruction alone, how many of the signal states or signal transitions onto which the test vector is mapped are provided in the test signal 103 for a current instruction.

As already described, the number of signal transitions or signal states of the current test vector to be provided in the signal 103 and defined in the current instruction can be smaller than the fixed number of signal states or signal transitions the current vector is mapped onto. In other words, the signal states or signal transitions provided in the signal 103 based on the current instruction are a subset of the signal states or signal transitions onto which the current test vector is mapped.

Further optional features of the automated test equipment 100 and of the test processor 101 will be described in more detail later on in conjunction with the examples shown in FIGS. 3A-3H and FIGS. 4A-4B.

Figure 2:
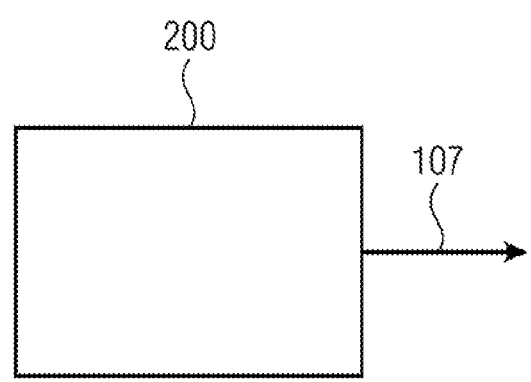
FIG. 2 shows a block schematic diagram of an instruction provider for providing a sequence of instructions defining an evaluation of test vectors according to an embodiment of the present invention.

FIG. 2 shows an instruction provider 200 for providing a sequence of instructions defining an evaluation of test vectors. The sequence of instructions provided by the instruction provider 200 is typically the sequence 107 of instructions which is received by the test processor 101 and based on which the test processor 101 provides the signal 103, thus the sequence of instructions provided by the instruction provider 201 is also given the reference sign 107.

Each test vector is associated with a predetermined set of signal states or signal transitions (as already described in conjunction with the automated test equipment 100). The instruction provider 200 is configured to provide the sequence 107 of instructions such that at least a first instruction (inside the sequence 107 of instructions) defines a provision (in the signal 103 provided to the device 105) of a (first) true subset of the signal states or signal transitions associated with a test vector.

In other words, the instruction provider 200 is configured to provide at least one instruction which defines a test vector and furthermore the number of signal states or signal transitions of a set of signal states or signal transitions associated with the test vector which are to be provided in the signal 103 to the device under test 105 by a test processor 101 receiving the sequence 107 of instructions. By having the first instruction defining a true subset of the signal states or signal transitions associated with the test vector a higher flexibility in a test pattern generation (when providing the signal 103) can be achieved when compared to systems, in which a test provider only provides instructions which define the provision of the complete set of signal states or signal transitions associated with the test vector.

Although the first instruction defines the true subset of signal transitions or signal states of the test vector to be provided to a device under test 105, the instruction provider 200 can be further configured to provide instructions (e.g. from a second type of instruction) which define a provision of the complete set of signal transitions or signal states of a test vector.

Furthermore, the instruction provider 200 may be configured to provide a further instruction which defines a provision of a further subset of the signal transitions and signal states of the test vector.

In other words, the signal provider 200 can be configured to provide the sequence 107 of instructions such that at least a second instruction in the sequence of instructions defines a provision of a further (or second) true subset or of the complete set of the signal states or signal transitions associated with the test vector. The second true subset differs from the first subset.

As an example, the first instruction may define the provision of the first n signal states or signal transitions of the test vector, while the second instruction defines the provision of the complete set (m) of signal transitions or signal states of the test vector or even of the first o number of signal states or signal transitions associated with the test vector, wherein n is different from o.

In the following, a detailed example of the concept of the present invention and its advantages over conventional test concepts is given.

FIG. 3a shows a table or a wavetable in which nine test vectors (from 0x00 to 0x08) are each assigned so-called actions (signal transitions or signal states). In the wavetable three different actions are shown: H, L, X, wherein H is a high signal state or a rising edge, L is a low signal state or a falling edge and X is a tristate or floating state or signals to maintain a value of the signal 103. Hence, the actions in the wavetable define the signal 103. As can be seen from FIG. 3a a wavetable entry contains the test vector and a fixed number of actions (in the example, 4 actions). A vector (or a test vector) is the index to the wavetable. A test processor sequencer program (of the test processor 101) generates a stream of vectors, each of which is then used to look up in the currently selected wavetable. The corresponding action determines the shape of the physical waveform (of the waveform of the signal 103) which is transmitted to the device under test 105.

FIG. 3b shows an example for an initial ATE test signal. This test signal comprises three times the vector 0x02, four times the vector 0x05 and two times the vector 0x03. This can be also seen in FIG. 3c in the RLE (Run Length Encoding) vector stream.

As every test vector has four different actions defined or in other words as for every test vector four signal states or four signal transitions are defined the xmode described above equals four.

As can be seen in FIG. 3c three vectors or three instructions are sufficient for providing the initial test signal shown in FIG. 3b.

FIG. 3d shows an updated test signal with two additional actions (signal states or signal transitions, H and L). As can be seen from FIG. 3d these two additional actions are to be inserted between the second vector 0x02 and the third vector 0x02. In a conventional test system this would lead to the vector stream as shown in FIG. 3e (without partial vector execution).

Hence, as the xmode 4 is chosen, the complete vector stream behind the two vectors 0x02 has to be changed and an additional padding has to be added to the end of the test signal for complying with the chosen xmode. Hence, the number of vectors or instructions used is seven and therefore four more than for the original vector stream.

FIG. 3f shows the test signal how it is received at a device under test and furthermore shows the partition of the test signal in the different new vectors.

In contrast to this FIG. 3g shows the vector stream using the concept of the present invention (with partial vector execution). It can be seen that only an additional instruction has to be inserted between the first two vectors 0x02 and the third vector 0x02 which defines the provision of the two first signal states or signal transitions of the vector 0x00. Hence, although the two new signal states or signal transitions are inserted into the test signal 103, the vector stream has only to be changed by inserting the instruction defining the provision of the first two signal states or signal transition of the vector 0x00 and by adding an additional instruction defining the provision of the complete vector 0x02. Hence, it can be seen that the number of vectors used for providing the signal 103 is five and therefore only two more when compared to the initial vector stream shown in FIG. 3c.

From FIG. 3g it can be seen that the new instruction inserted between the first two vectors 0x02 and the third vector 0x02 allows a lot of flexibility on the software side to easily assemble packets and to perform fast modifications even to a compiled pattern.

To summarize, the automated test equipment 100 can comprise a table (the table shown in FIG. 3a) which comprises a test vector and per test vector an associated set of signal states or signal transitions. The test processor 101 is configured to map the current test vector on its associated signal states or signal transitions based on the table.

Furthermore, a number of signal states or signal transitions associated with a test vector can be equal for different test vectors (in the example 4). Furthermore, a current test vector can be mapped onto m signal states or signal transitions. The test processor 101 is configured to select n signal states or signal transitions of the current test vector (in the example the test vector 0x00) based on a current instruction for providing in the test signal 103 and to omit providing the remaining m-n signal transitions or signal states in the test signal 103.

As can be seen, the final test signal 103 shown in FIG. 3h only comprises the first two actions (H,L) of the vector 0x00 while the third and fourth actions (X,X) are discarded or omitted and are therefore not part of the signal test 103.

Hence, in the current example shown in FIG. 3h, m=4 and n=2. Nevertheless, n could also be 1 or 3 or, for example for only providing the first signal state or signal transition of the test vector 0x00 or for providing the first three signal states or signal transitions of the test vector 0x00. Furthermore, as can be seen from FIG. 3h, the sequence of the signal states or signal transitions onto which the current vector is mapped can be fixed such that the n selected signal states or signal transitions are the first n signal states or signal transitions in the set of signal states or signal transitions mapped onto the current test vector. In the example shown in FIG. 3h the two signal states or signal transitions added to the test signal 103 are the first two signal states or signal transitions in the set of signal states or signal transitions mapped onto the vector 0x00.

As already described in the foregoing, the number n of signal states or signal transitions of a current test vector to be provided in the signal 103 can be variable, as the test processor 101 is configured to variably select the number of signal states or signal transitions of a test vector to be provided in the signal 103 in dependence on a current instruction. Hence, the test processor 101 can be configured to, in response to a first instruction in the sequence of instructions select and provide in the signal 103 a first number of signal states or signal transitions based on the current test vector (onto which the signal states or signal transitions are mapped). Furthermore, the test processor is configured to, in response to a second instruction in the sequence 107 of instructions select and provide in the signal 103 a second number of signal states or signal transitions based on the current test vector onto which the signal states or signal transitions are mapped. The first number is different from the second number. As an example, the first instruction may define the provision of two signal states or signal transitions of the test vector out of four signal states or signal transitions mapped onto the test vector and the second instruction may define the provision of three signal states or signal transitions of the test vector.

FIGS. 4A-4B show a comparison between the original operational code (FIG. 4a) for providing the initial ATE test signal shown in FIG. 3b and the modified operational code (FIG. 4b) for the final test signal 103 shown FIG. 3h after the modification and using the partial vector execution concept of the present invention.

From FIG. 4a it can be seen that the original operational code only comprises three single instructions wherein the first instruction defines the provision of the vector 0x02 three times, the second instruction defines the provision of the vector 0x05 four times and the third instruction defines the provision of the vector 0x03 two times.

From the modified operational code in FIG. 4b it can be seen that the first instruction of the original operational code for providing the vector 0x02 three times is split in a first instruction of providing the vector 0x02 two times and a third instruction of providing the vector 0x02 one time. In between these two instructions, a new instruction has been inserted, which defines the provision of two signal transitions or signal states (or in general two actions) from vector 0x00 one time. Furthermore, as can be seen from FIG. 4b, the rest of the operational code (for providing the vector 0x05 and the vector 0x03) can remain unchanged.

From FIG. 4b it can seen that the instruction provider 200 which provides the sequence 107 of instructions as shown in FIG. 4b is configured to provide the sequence 107 of instructions such that at least the instruction REPEAT_E which defines the provision of a true subset of the vector 0x00 contains an information defining a number of times the true subset is to be provided subsequently. In the example shown in FIG. 4b the two signal states or signal transitions of the vector 0x00 are only to be generated one single time. Nevertheless, other possibilities (such as a plurality of repetitions of these signal states or signal transitions) are possible also. Furthermore, this possibility of defining how often a subset or a complete vector is to be generated can also be defined in the instructions which define a provision of the complete set of signal transitions or signal states of a test vector (such as the instruction REPEAT in the example in FIG. 4b).

Furthermore, as can be seen in FIG. 4b the instruction provider 200 is configured to provide in the sequence 107 of instructions at least a first type of instruction (the REPEAT_E instruction) defining a test vector and a number of signal states or signal transitions of the set associated with the test vector to be provided in the signal 103 to the device under test 105. Furthermore, the instruction provider 200 is configured to provide a second type of instruction defining a test vector and defining that the complete set of signal states or signal transitions associated with the test vector is to be provided in the test signal 103 to the device under test 105 (in the example shown in FIG. 4 the REPEAT instruction). Both types of these instructions may further comprise the information on how often the corresponding signal states or signal transitions of the test vectors are to be provided in the test signal 103 subsequently.

Accordingly, also the test processor 101 is configured to process the first type of instruction defining the provision of a true subset of the set of signal states or signal transitions mapped onto a test vector and to process the second type of instruction defining the provision in the signal 103 of a complete set of signal transitions or signal states mapped onto a test vector.

Furthermore, the test processor 101 is also configured to subsequently repeat the selected number of signal states or signal transitions (the subset of signal states or signal transitions) provided in the signal 103 of a current test vector in dependence on a number of repetitions defined in the current instruction for this current test vector.

Figure 5:
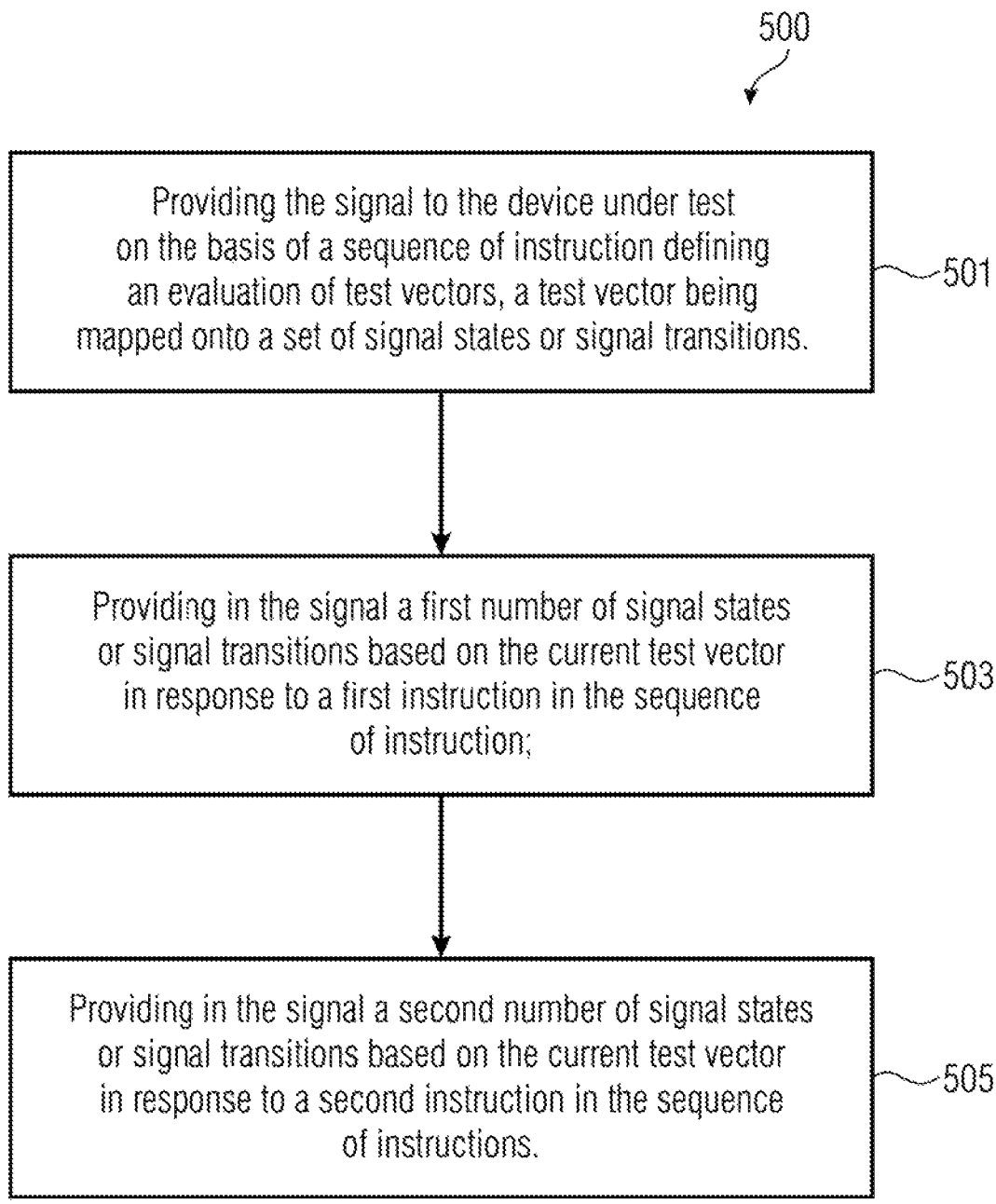
FIG. 5 shows a flow diagram of a method for providing a signal to a device under test according to an embodiment of the present invention.

FIG. 5 shows a flow diagram of a method 500 for providing a signal to a device under test. The method 500 can be performed, for example, by the test processor 101 in conjunction with the automated test equipment 100.

The method 500 comprises a step 501 of providing the signal to the device under test on the basis of a sequence of instructions defining an evaluation of test vectors, a test vector being mapped onto a set of signal states or signal transitions. A number of signal states or signal transitions of a current test vector provided in the signal is variably selected in dependence on a current instruction.

Furthermore, the method 500 may comprise a step 503 of providing in the signal (or selecting for a provision in the signal) a first number of signal states or signal transitions based on the current test vector in response to a first instruction in the sequence of instructions.

Furthermore, the method 500 may comprise a step 505 of providing in the signal (or selecting for a provision in the signal) a second number of signal states or signal transitions based on the current test vector in response to a second instruction in the sequence of instructions, wherein the first number is different from the second number.

The first instruction defines a first number of signal states or signal transitions of a set of signal states or signal transitions mapped onto the current test vector. The first number may be a true subset of the signal states or signal transitions of the set mapped onto the current test vector or may be even the full set of signal states or signal transitions. The second instruction defines the provision of a second number of signal states or signal transitions of the set of signal states or signal transitions associated with the current test vector, wherein the second number is different from the first number.

Figure 6:
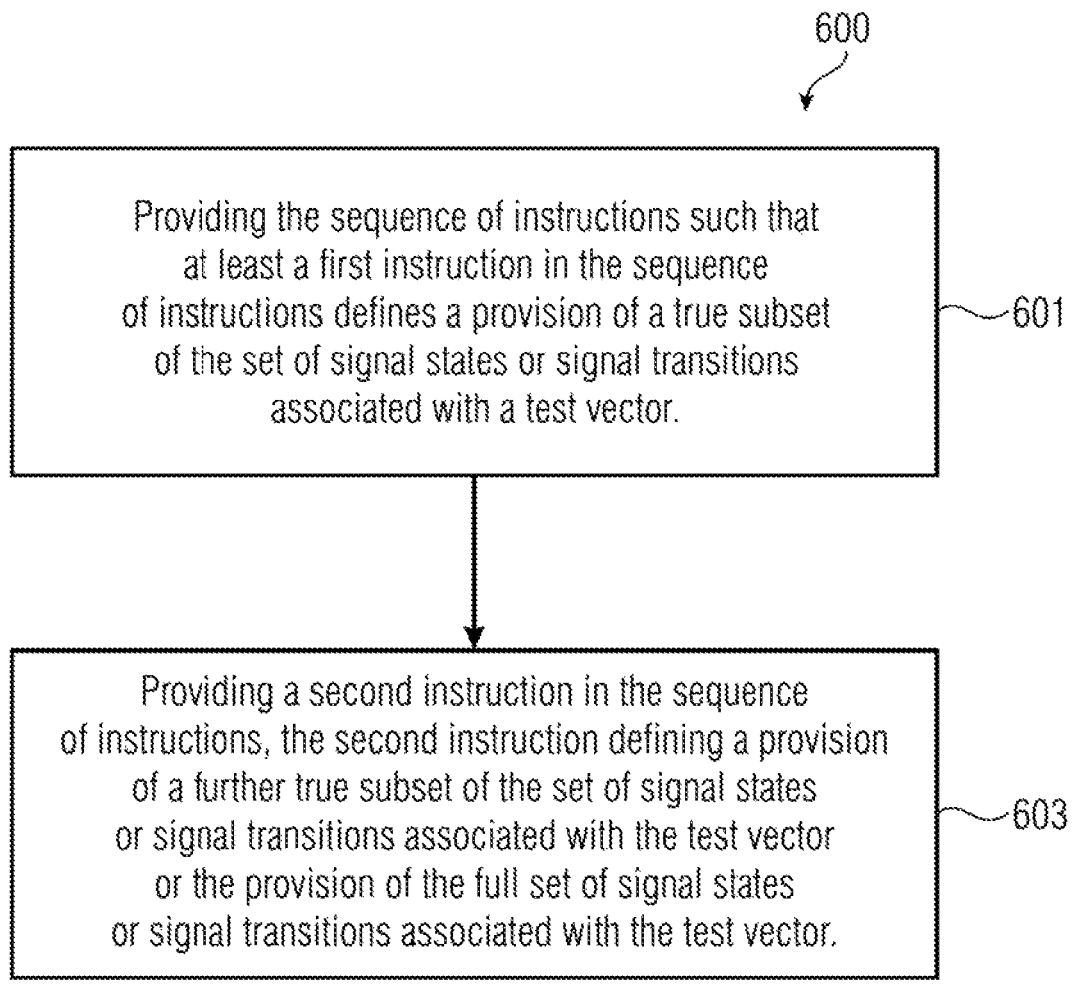
FIG. 6 shows a flow diagram of a method for providing a sequence of instructions defining an evaluation of test vectors according to an embodiment of the present invention.

FIG. 6 shows a flow diagram of a method 600 for providing a sequence of instructions defining an evaluation of test vectors. Each test vector is associated with a predetermined set of signal states or signal transitions.

The method 600 comprises a step 601 of providing the sequence of instructions such that at least a first instruction (in the sequence of instructions) defines a provision of a true subset of a set of signal states or signal transitions associated with a test vector.

The method may further comprise a step 603 of providing a second instruction in the sequence of instructions, the second instruction defining a provision of a further true subset of the set of signal states or signal transitions associated with the test vector or the provision of the full set of signal states or signal transitions associated with the test vector.

Further embodiments of the present invention relate to a test system comprising the automated test equipment 100 and the instruction provider 200. In more detail, the instruction provider 200 may be part of the automated test equipment 100 for providing the sequence 107 of instructions to the test processor 101.

The methods 500, 600 may be supplemented by any of the features and functionalities described herein with respect to the apparatus, and may be implemented using the hardware components of the apparatus.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A system comprising automated test equipment, the system comprising:
    a test processor configured to provide a signal to a device under test based on a sequence of instructions defining an evaluation of test vectors, wherein each of the test vectors is mapped onto a fixed number of signal states or signal transitions;
    wherein the test processor is configured to map a current test vector onto a set of signal states or signal transitions in dependence on a current instruction; and
    wherein the test processor is configured to select a number less than the number of the fixed number of the signal states or signal transitions of the current test vector to be provided in the signal in dependence on the current instruction.

2. The system comprising automated test equipment according to claim 1, wherein the number of signal states or signal transitions of the current test vector to be provided in the signal and defined in the current instruction is smaller than the fixed number of signal states or signal transitions of the set of signal states or signal transitions onto which the current test vector is mapped onto.

3. The system comprising automated test equipment according to claim 1,
    wherein the test processor is configured to process a first type of instruction defining provision, in the signal, of a true subset of the set of signal states or signal transitions onto which a test vector is mapped and is also configured to process a second type of instruction defining the provision, in the signal, of a complete set of signal transition or signal states onto which the test vector is mapped; and
    wherein the current instruction is from the first type of instruction.

4. The system comprising automated test equipment according to claim 1, wherein the test processor is configured to subsequently repeat a selected number of signal states or signal transitions in the signal in dependence on a number of repetitions defined in the current instruction.

5. The system comprising automated test equipment according to claim 1, further comprising:
    a table comprising the test vectors and per test vector an associated set of signal states or signal transitions; and
    wherein the test processor is configured to map the current test vector on its associated set of signal states or signal transitions based on the table.

6. The system comprising automated test equipment according to claim 1,
    wherein the current test vector is mapped onto m signal states or signal transitions, where m is a positive integer value; and
    wherein the test processor is configured to select n signal states or signal transitions onto which the current test vector is mapped based on the current instruction for providing in the signal and to omit providing the remaining m minus n signal transitions or signal states onto which the current test vector in the signal, where n is a positive integer value.

7. The system comprising automated test equipment according to claim 6, wherein a sequence of the signal states or signal transitions onto which the current test vector is mapped is fixed such that the n selected signal states or signal transitions are the first n signal states or signal transitions in the set of signal states or signal transitions onto which the current test vector is mapped.

8. The system comprising automated test equipment according to claim 1,
wherein the test processor is configured to, in response to a first instruction in the sequence of instructions select and provide in the signal a first number of signal states or signal transitions based on the current test vector and to, in response to a second instruction in the sequence of instructions select and provide in the signal a second number of signal states or signal transitions based on the current test vector; and
wherein the first number of signal states or signal transitions is different from the second number of signal states or signal transitions.

9. A method for providing a signal to a device under test, the method comprising:
providing the signal to the device under test based on a sequence of instructions defining an evaluation of test vectors, a test vector being mapped onto a set of signal states or signal transitions;
wherein a number of signal states or signal transitions of a current test vector provided in the signal is variably selected in dependence on a current instruction;
wherein each of the test vectors is mapped onto a fixed number of signal states or signal transitions; and
selecting a number less than the fixed number of signal states or signal transitions of the current test vector to be provided in the signal in dependence on the current instruction.

10. The method according to claim 9, further comprising:
providing in the signal a first number of signal states or signal transitions based on the current test vector in response to a first instruction in the sequence of instructions; and
providing in the signal a second number of signal states or signal transitions based on the current test vector in response to a second instruction in the sequence of instructions; and wherein the first number of signal states or signal transitions is different from the second number of signal states or signal transitions.

11. A system comprising an instruction provider for providing a sequence of instructions defining an evaluation of test vectors, wherein each test vector is associated to a predetermined number of signal states or signal transitions;
wherein the instruction provider is configured to provide the sequence of instructions such that at least a first instruction in the sequence of instructions defines provision of a true subset of the predetermined number of signal states or signal transitions associated with a first test vector;
wherein the instruction provider is configured to provide in the sequence of instructions a first type of instruction defining the first test vector and a number of signal states or signal transitions in the true subset of the predetermined number of signal states or signal transitions associated with the first test vector; and wherein the instruction provider is further configured to provide in the sequence of instructions a second type of instruction defining a second test vector and provision of a complete set of the predetermined number of signal states or signal transitions associated with the second test vector.

12. The system comprising an instruction provider according to claim 11,
wherein the instruction provider is configured to provide the sequence of instructions such that at least a second instruction defines a provision of a further true subset of the predetermined number of signal states or signal transitions associated to the first test vector or of the complete set of signal states or signal transitions associated to the first test vector, and
wherein the further true subset is different from the true subset.

13. The system comprising an instruction provider according to claim 11, wherein the instruction provider is configured to provide the sequence of instructions such that at least the first instruction comprises information defining a number of times the true subset is to be provided subsequently.

14. A method for providing a sequence of instructions defining an evaluation of test vectors, wherein each test vector is associated with a predetermined number of signal states or signal transitions, the method comprising:
providing the sequence of instructions such that at least a first instruction in the sequence of instructions defines provision of a true subset of the predetermined number of signal states or signal transitions associated with a first test vector;
providing in the sequence of instructions a first type of instruction defining the first test vector and a number of signal states or signal transitions in the true subset of the predetermined number of signal states or signal transitions associated with the first test vector; and
providing in the sequence of instructions a second type of instruction defining a second test vector and provision of a complete set of the predetermined number of signal states or signal transitions associated with the second test vector.

15. The method according to claim 14, further comprising:
providing a second instruction in the sequence of instructions, the second instruction defining a provision of a further true subset of the predetermined number of signal states or signal transitions associated with the test vector or the provision of a full set of signal states or signal transitions associated with the test vector.

16. A test system comprising:
the automated test equipment according to claim 1; and
an instruction provider for providing a sequence of instructions defining an evaluation of test vectors, wherein each test vector is associated to a predetermined set of signal states or signal transitions;
wherein the instruction provider is configured to provide the sequence of instructions such that at least a first instruction in the sequence of instructions defines a provision of a true subset of the predetermined set of signal states or signal transitions associated with a test vector;
wherein the instruction provider is configured to provide in the sequence of instructions a first type of instruction defining a test vector and provision of a number of signal states or signal transitions of the predetermined set of signal states or signal transitions associated with the test vector;

wherein the first instruction is from the first type of instruction; and wherein the instruction provider is further configured to provide in the sequence of instructions a second type of instruction defining a test vector and provision of a complete set of the predetermined set of signal states or signal transitions associated with the test vector.

17. A non-transitory digital storage medium having a computer program stored thereon to perform the method according to claim 9 when the computer program is run by a computer.

18. A non-transitory digital storage medium having a computer program stored thereon to perform the method according to claim 14 when the computer program is run by a computer.

\* \* \* \* \*